United States Patent [19]

Bose

[11] Patent Number: 4,876,457
[45] Date of Patent: Oct. 24, 1989

[54] METHOD AND APPARATUS FOR DIFFERENTIATING A PLANAR TEXTURED SURFACE FROM A SURROUNDING BACKGROUND

[75] Inventor: Chinmoy B. Bose, Green Brook, N.J.

[73] Assignee: American Telephone and Telegraph Company, New York, N.Y.

[21] Appl. No.: 264,709

[22] Filed: Oct. 31, 1988

[51] Int. Cl.⁴ .................................... G01N 21/88
[52] U.S. Cl. .......................... 250/563; 356/445
[58] Field of Search ............ 250/562, 563, 571, 572; 356/430, 431, 445; 382/50, 65

[56] References Cited

U.S. PATENT DOCUMENTS 4,682,040  7/1987  Hohki et al. .................. 356/445
4,794,265  12/1988  Quackenbos et al. ............ 250/572

OTHER PUBLICATIONS

A. P. Pentland, "A New Sense for Depth of Field," IEEE Transactions on Pattern Analysis and Machine Intelligence, vol. PAMI-9, No. 4, Jul. 1987, pp. 523–531.

T. Darrell and K. Wohn, "Calculating Depth from Focus Using a Pyramid Architecture" SPIE, vol. 849, Automated Inspection and High Speed Vision Architectures (1987), pp. 57–62.

Primary Examiner—David C. Nelms
Attorney, Agent, or Firm—Robert B. Levy

[57] ABSTRACT

A textured planar surface (15) on a semiconductor chip (10) is distinguished from a volume of surrounding bonding material (12) by first illuminating the chip and the bonding material with light directed normal to the surface. Thereafter, the image of the surface (15) is captured by a television camera (30) such that the textured planar surface is in focus and the bonding material appears out of focus to the camera. The image captured by the camera is processed by a vision processor (32) which first determines the intensity gradient for each separate small area (pixel) in the image and then creates a gradient image based on the pixel intensity gradients. The gradient image is binarized by causing each pixel to appear dark or bright, depending on whether its intensity gradient is below or above a threshold value. The surrounding bonding material is effectively eliminated from the binarized image because the corresponding pixels associated therewith appear dark since they have a low intensity gradient as a result of the bonding material being out of focus.

13 Claims, 4 Drawing Sheets

METHOD AND APPARATUS FOR DIFFERENTIATING A PLANAR TEXTURED SURFACE FROM A SURROUNDING BACKGROUND

TECHNICAL FIELD

This invention relates to a technique for differentiating a planar texture surface on an article from a background region surrounding the surface.

BACKGROUND OF THE INVENTION

During the manufacture of different kinds of articles, one or more visual inspections are often performed, so that defects, such as scratches and stains which only manifest themselves visually, can be detected. In many instances, visual inspection of articles during their manufacture is performed by one or more commercially available machine vision systems. Typical machine vision systems are highly accurate, usually much more so than a human inspector whose accuracy will be influenced by factors such as eye strain, fatigue and boredom, which are thus avoided by the use of a machine vision system.

While present day machine vision systems are useful for detecting defects on a wide variety of articles, such systems sometimes incur difficulties in detecting specific defects on certain types of articles. For example, it has not been feasible to use present day automated machine vision systems to detect defects such as edge cracks on an exposed surface of a semiconductor chip surrounded by a volume of bonding material. This is because many present day systems cannot always accurately differentiate between the edge of the chip and the bonding material. Typically, the chip has a textured surface (i.e., the surface contains a large number of features), as does the bonding material, which is typically a eutectic, like solder. Thus, to the machine vision system, the chip and the surrounding bonding material may appear very similar.

Thus, there is a need for a technique for differentiating between a planar textured surface on an article, such as the exposed surface on a semiconductor chip, from a background region, such as a volume of bonding material surrounding the chip.

SUMMARY OF THE INVENTION

Briefly, in accordance with a preferred embodiment of the invention, a technique is provided for differentiating between a planar textured surface on an article of interest and a background region surrounding the surface. To accomplish such differentiation, both the textured surface and the background region are illuminated by directing light so it strikes the surface and the background region substantially normal to the plane of the surface. The combined images of the surface and the surrounding background region are captured by an image-acquisition device, typically a television camera having a lens assembly thereon. The optical axis of the television camera is substantially perpendicular to the plane of the surface. The optical characteristics of the lens assembly of the television camera are such that the background region appears substantially defocused within the captured image while the surface itself appears sharply focused.

The captured image is processed to determine the intensity (i.e., brightness) of each of a plurality of small areas (pixels) within the image. The intensity gradient for each pixel within a small neighborhood thereabout is then determined. Next, a gradient image is created by assigning each pixel within the image an intensity value equal to its intensity gradient. Thereafter, the gradient image is binarized by assigning each pixel a zero intensity value or a very high intensity value, so the pixel appears black or white, respectively, depending on whether its intensity is below, and above, a threshold value. The resultant binarized image will contain essentially none of the background region because the pixels comprising the de-focused background region typically have low intensity gradients, and are thus typically assigned a zero intensity value during the binarization process. The reason why the pixels in the background region have a low intensity gradient is that there are no sharp variations in the intensity from pixel to pixel as a result of the background region being de-focused.

Once the textured planar surface has been isolated in the above manner, it is possible to detect the edges thereof if the entire image of the surface has been captured at the outset. The edges of the textured planar surface can be found by establishing, at selected sampling intervals along each of a pair of coordinate axes, the first location where there is a large difference in the intensity between the neighboring pixels. From the location at each of the sampling intervals where there is a pixel intensity transition, the expected location of the edges of the surface can be mathematically defined by an appropriate curve-fitting technique, such as linear regression when the edges are straight. Once the edges have been mathematically defined, it is then possible to inspect the edges for cracks by determining whether the actual location of the edge of the surface (as determined from the location where the first intensity transition occurred) coincides with the expected (i.e., mathematically defined) location of the edge of the surface.

DETAILED DESCRIPTION

Figure 1:
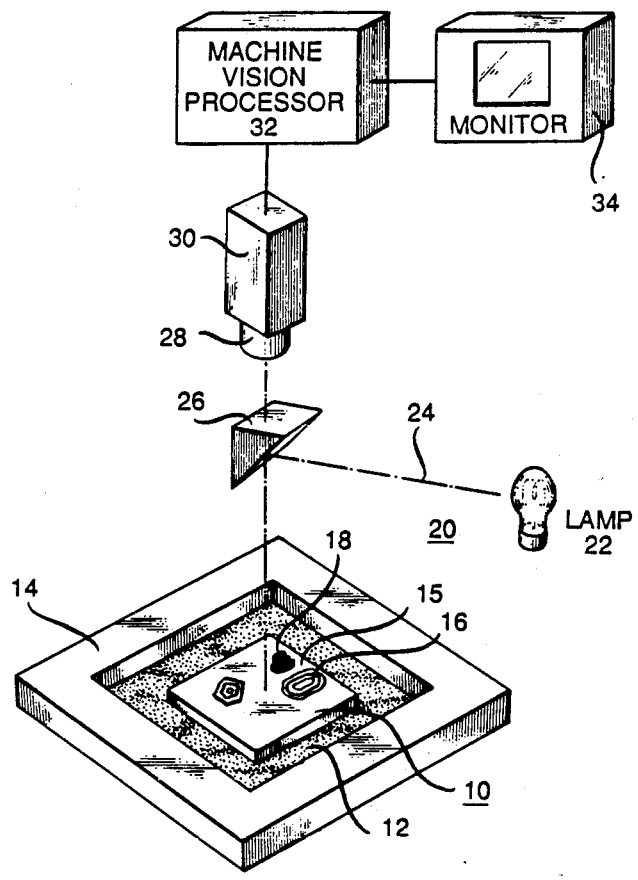
FIG. 1 shows a block schematic diagram of an apparatus, in accordance with a preferred embodiment of the invention, for differentiating (i.e., isolating) an exposed textured surface on a semiconductor chip from a volume of bonding material surrounding the chip.

FIG. 1 is a perspective view of a semiconductor chip 10, which is surrounded by, and which overlies a portion of, a volume of bonding material 12 (i.e., solder) that secures the chip within a recess in a chip carrier 14 such that the chip has its major surface 15 exposed.

After the chip 10 has been secured in the chip carrier 14, it is often desirable to inspect the exposed surface 15, which typically has a pattern of very fine features 16 thereon and thus appears textured. The purpose of such an inspection is to locate the surface 15 to facilitate identification of the features 16 or the detection of a defect 18 such as an edge crack, which may not manifest itself by an electrical test of the chip 10. Typically, the only way to detect this type of defect 18 is by visual inspection. Heretofore, automated visual detection of the defect 18 has proven difficult because the bonding material 12, upon hardening, generally has a textured appearance which is difficult to differentiate from the surface 15 which, because of the presence of the features 16, also appears textured.

In FIG. 1, there is shown an apparatus 20, in accordance with a preferred embodiment of the invention, for differentiating (i.e., isolating) the textured surface 15 from the textured bonding material 12. The apparatus 20 includes a light source 22, such as a halogen-tungsten lamp or the like, which produces a beam of light 24 that is directed horizontally into a beam splitter 26. The beam splitter 26, which is conventional in its construction, directs the beam 24 downwardly at the chip 10 so that the beam is substantially normal to the plane of the surface 15. In addition, the beam splitter 24 serves to direct those portions of the beam 24, which are reflected substantially normally upward from the surface 15, into an optical assembly 28 (typically a lens) mounted on an image-acquisition device 30. The image-acquisition device 30 typically takes the form of a television camera whose optical axis is positioned substantially perpendicular to the plane of the surface 15 for capturing the image of the surface, that is, for sensing the intensity of the light reflected normally therefrom. The properties of the optical assembly 28 are selected such that only the surface 15 of the chip 10 appears sharply focused to the television camera 30. The bonding material 12 surrounding the chip 10 is out of focus and, thus, its image appears blurred.

The technique of illuminating the chip 10 by directing the beam 24 at the surface 15 substantially normal to the plane thereof and then sensing the intensity of the light reflected substantially normal to the plane of the surface is known as "bright field illumination." In contrast, "dark field illumination" would be achieved by directing the beam 24 towards the surface 15 at an acute angle with respect to the plane thereof and then sensing the intensity of the light reflected normally from the surface. Bright field illumination is preferable in this case because those areas on the surface 15 not occupied by a feature 16 or defect 18 will reflect substantially all of the incident beam 24 into the television camera 30. Those portions of the beam 24 striking either a feature 16 or a defect 18 will be scattered in many directions, with only a small fraction of the scattered light entering the television camera 30. Consequently, the image of the surface 15 appears generally bright, except for the features 16 and the defect 18 which appear dark, yielding a very high contrast. With dark field illumination, the contrast between a feature 16 or defect 18, and the area on the surface 15 surrounding the defect or feature, will be relatively small, which is less desirable.

Under bright field illumination, the background material 12 appears mostly dark, with the exception of a few de-focused bright spots resulting from the uneven flow of the material during bonding of the chip 10 to the chip carrier 14. The reason why the bonding material 12 appears mostly dark is that the bonding material, as it hardens, forms an uneven topological mass, as contrasted with the planar surface 15. With the bonding material 12 appearing mostly dark and the surface 15 appearing mostly bright (except those areas occupied by a feature 16 or defect 18), there will be a very sharp contrast between the edges of the surface 15 of the chip 10 and the bonding material. The sharp contrast within the captured image between the edges of the surface 15 of the chip 10 and the bonding material 12 will result in a larger intensity gradient at the edges of the surface, than under dark field illumination. There will also be intensity gradients on the surface 15 because of the textured appearance of the surface due to those features 16 which appear dark under bright field illumination. Thus there is a distinct advantage in using bright field illumination. However, in relatively simple cases where there are few features 16 on the surface 15, dark field illumination may be used instead.

In addition to the television camera 30, the inspection apparatus 20 further includes a machine vision processor 32 which is coupled to the camera for processing its output signal, typically analog voltage which varies in accordance with the intensity of the image captured by the camera. The vision processor 32 typically takes the form of a commercial vision system, such as the model P256 vision system manufactured by IRI Corp., Carlsbad, Calif. The vision processor 32 is coupled to a monitor 34 so that the output of the vision system can be displayed.

Figure 2:
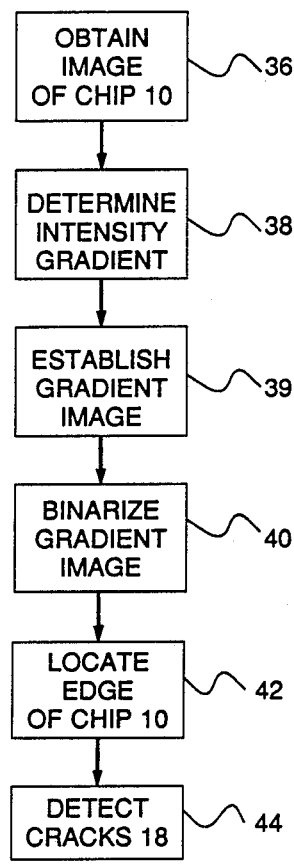
FIG. 2 shows a flowchart diagram of a program executed by the apparatus of FIG. 1 to differentiate between the pattern on the chip and the bonding material.
Figure 3:
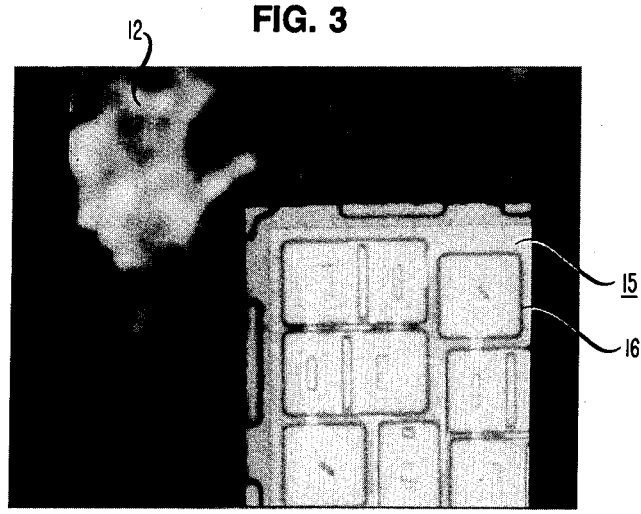
FIG. 3 shows the image of the chip and that of the surrounding bonding material, as captured by the apparatus of FIG. 1.

FIG. 2 shows a flowchart representation of a program executed by the vision processor 32 to differentiate the image of the surface 15 of the chip 10 from the bonding material 12, all of FIG. 1. To accomplish such differentiation, the vision processor 32 first obtains the image of the surface 15 of the chip 10 during step 36 of FIG. 2. The processor 32 obtains the image of the surface 15 by converting the analog output signal of the camera 30 of FIG. 1 into a stream of digital signals, each representing the intensity of a separate small area (pixel) within the image captured by the camera. The digital signal representing the intensity of each pixel is typically eight bits in length, so the intensity (as measured in shades of gray) of each pixel may range in value between 0 (black) and 255 (white). FIG. 3 shows the image of the surface 15 of FIG. 1 obtained by the vision processor 32 during step 36 of FIG. 2.

During step 36 of FIG. 2, the vision processor 32 typically converts the output signal of the camera 30 of FIG. 1 into 61,440 digital signals, each representing the intensity of a separate one of the pixels within a 240×256 pixel array comprising the image of the surface 15 of FIG. 1 captured by the camera. In practice, the properties of the optical assembly 28 of FIG. 1 are selected such that each of the pixels within the 240×256 array corresponds to a 5 $\mu$m×5 $\mu$m area on the surface 15. It should be understood that the particular size of the pixel array is dependent on the characteristics of the vision processor 32 and the television camera 30 and that larger arrays are possible. Further, the physical size of the area corresponding to each pixel within the array is dependent on the properties of the optical assembly 28 of FIG. 1.

Figure 4:
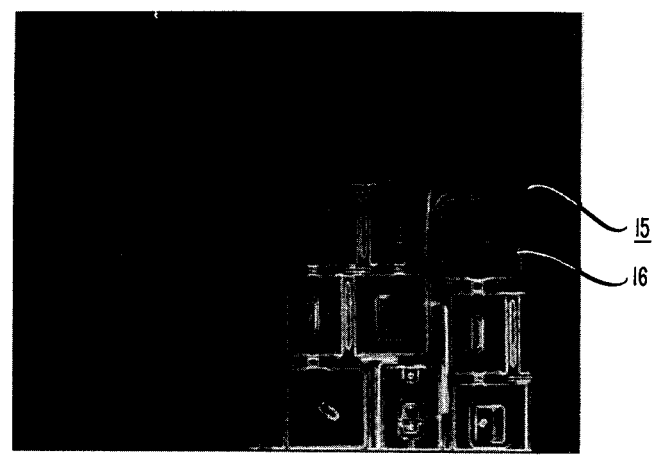
FIG. 4 shows the gradient image of the semiconductor chip and the surrounding background material.

Referring to FIG. 2, following step 36, the vision processor 32 of FIG. 1 next determines the intensity gradient of each pixel within the image of FIG. 3 during step 38. The intensity gradient, which represents the change in the intensity from the pixel to a neighboring pixel, is obtained by using a gradient operator, such as the Robert or Sobel operator, at each pixel within a 3×3 array of neighboring pixels. Following step 38, a "gradient" image of the surface 15 is created during step 39 by assigning each pixel in the captured image an intensity value proportional to the intensity gradient at that point rather than its true intensity. FIG. 4 shows the gradient image created during step 39. As may be appreciated by comparison of FIGS. 3 and 4, the bonding material 12 which surrounds the chip 10 of FIG. 1 can be seen in FIG. 3 but has been virtually eliminated in FIG. 4.

In order to completely isolate the image of the surface 15 of FIG. 1 from that of the bonding material 12, the vision processor 32 thresholds (binarizes) the gradient image of FIG. 4 during step 40 of FIG. 3. The vision processor 32 of FIG. 1 binarizes the gradient image of FIG. 4 by causing each pixel in the image to appear either white or black, depending on whether the pixel's intensity is above or below, respectively, a threshold value. In practice, the threshold value is set by trail and error so as to be significantly above the highest probable intensity gradient of the pixels comprising the background bonding material 12 in the image in FIG. 3.

Figure 5:
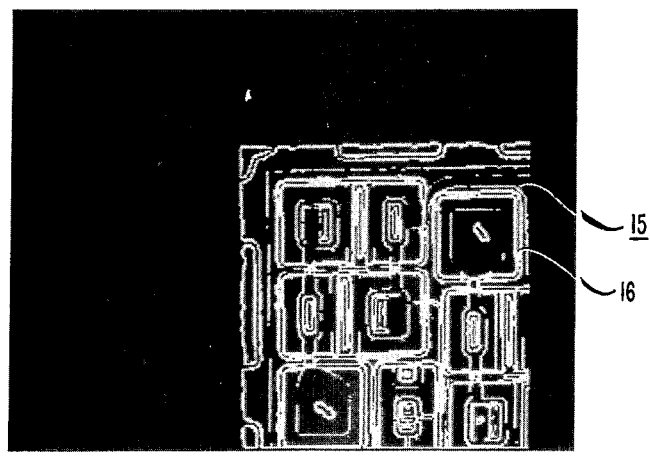
FIG. 5 shows the gradient image of FIG. 4 after binarization.

The binarized gradient image of the surface 15 of FIG. 1 and the surrounding bonding material 12 of FIG. 1 is seen in FIG. 5. As may be appreciated by reference to this figure, only the pixels comprising the locations with high-intensity gradients such as the chip edges and the features 16 on the surface 15 appear white. In contrast, the pixels in FIG. 5 comprising the image of the bonding material 12 of FIG. 1 appear black since each typically has a small intensity gradient. The reason why the pixels comprising the image of the bonding material 12 have a small pixel intensity gradient is that the bonding material appears out of focus to the television camera 30 of FIG. 1. Therefore, none of the sharp features of the bonding material 12 are seen by the television camera 30. As a result, there will be only small differences in the intensity between each of the pixels comprising the image of the bonding material 12. Thus, when the gradient image of the surface 15 and bonding material 12 is binarized during step 40 of FIG. 2, the bonding material is effectively removed from the image.

Once the surface 15 of the chip 10 has been isolated by binarizing the image of FIG. 4 during step 40 of FIG. 2, the edges of the surface are located during step 42 to facilitate detection of the cracks 18. One way in which the edges of the surface 15 can be located during step 42 of FIG. 2 is to run length code the pixels in the image of FIG. 5. Run length coding of the pixels in the image of FIG. 5 is accomplished by successively comparing the intensity of neighboring pixels in a first direction along each of a pair of coordinate axes, at selected sampling intervals along each axis. If a large difference in the intensity exists between a pair of neighboring pixels (i.e., there is an intensity transition), then the location where the transition occurred is recorded. As between two neighboring black pixels or two neighboring white pixels, there will be no difference in their intensity. Only between a neighboring black and white pixel will there be a difference or transition between their intensities.

As may be appreciated, the only white pixels which are present in the image of FIG. 5 are those comprising the image of the textured surface 15 of the chip 10. The pixels in the image of FIG. 5 representing the bonding material 12 of FIG. 1 are all dark (i.e., black), so at the edges of the surface 15 there should be a difference in the intensity between the two neighboring pixels. Therefore, the location, at each selected sampling interval, along each coordinate axis, of the first pixel intensity transition, should lie along a separate one of a first pair of intersecting edges of the surface 15 of the chip 10 as depicted schematically in FIG. 7. To establish the locations of the pixel intensity transitions which lie along a separate one of the other pair of intersecting chip surface edges, the pixels in the image of FIG. 5 are run length coded in the opposite direction as before along each coordinate axis at selected sampling intervals along the axis.

Figure 7:
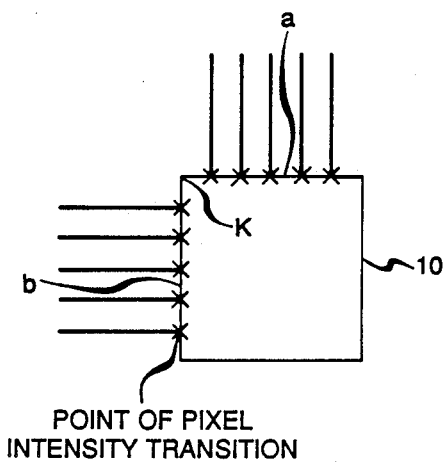
FIG. 7 is simplified top view of the semiconductor chip appearing in the image of FIG. 3, showing at least one of the corners thereof.

From a knowledge of the coordinate locations of the points where such pixel intensity transitions have occurred, the edges of the surface 15 of the chip 10 can be mathematically defined by linear regression. In this regard, it is assumed that each of the edges of the surface 15 of the chip 10, as shown in FIG. 7, is straight and can be modeled by the equation:

$$y = mx + c \tag{1}$$

where m is a constant less than 1. The values of m and c are obtained from equations (2) and (3), respectively.

$$m = \frac{\Sigma(x_i y_i) - \frac{(\Sigma x_i)(\Sigma y_i)}{N}}{\Sigma(x_i^2) - \frac{(\Sigma x_i)^2}{N}} \tag{2}$$

$$c = \frac{\Sigma y_i - m \Sigma x_i}{N} \tag{3}$$

values $x_i$ and $y_i$ represent a separate one of the x and y locations of each of a set of N points where a pixel intensity transition occurred along an edge.

To find the coordinates for each corner of the surface 15 of the chip 10, it is necessary to find those values which satisfy the equation for each of the two intersecting edges. As an example, consider the upper left-hand corner, identified by the reference letter k, at the intersection of the edges, identified by the reference letters a and b in FIG. 7. From the discussion above, the edges a and b can be mathematically defined by the equations $$y_a = m_a x + c_a \tag{4}$$

$$x_b = m_b y + c_b \tag{5}$$

Equation (5) has been written in slightly different format from equation (1) in order to keep the computational error low by keeping $m_b$ small.

The coordinates $x_k, y_k$ which define the location of the corner k must satisfy both of equations (4) and (5). The coordinates $y_k$ and $x_k$ can be established from equations (6) and (7).

$$y_k = \frac{c_a + m_a c_b}{1 - m_a m_b} \tag{6}$$

$$x_k = m_b y_k + c_b \tag{7}$$

Figure 6:
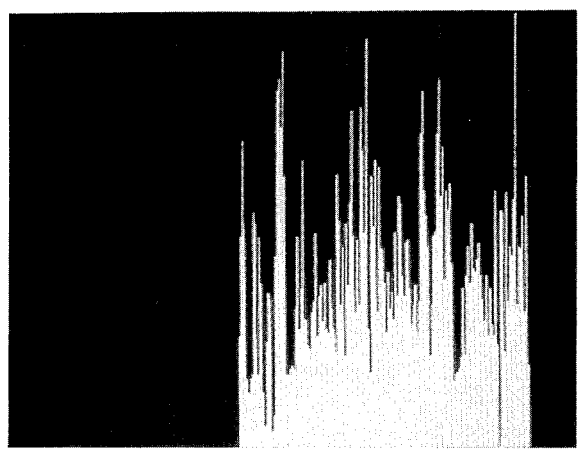
FIG. 6 is a profile of the intensity, along one of a pair of coordinate axes, of the pixels within the image of FIG. 5.

It is possible to speed up the process of locating the edges of the chip 10 by first establishing the approximate location of the chip corners. This may be done by profiling the binarized gradient image of FIG. 5 along each of a pair of coordinate axes by summing the intensity of the pixels along the opposite axis. FIG. 6 shows the profile of the binarized gradient image of FIG. 5 for the x axis. A similar profile (not shown) can be obtained for the y axis.

As discussed previously, within the image of FIG. 5, the only bright (i.e., white) pixels which are present are associated with the image of the textured surface 15 of the chip 10. Hence, outside the area occupied by the surface 15, the pixels within the image of FIG. 5 are dark so that the sum of their intensities will be zero. Therefore, the first and last non-zero points on the intensity profile in FIG. 6 yield the approximate location of each of a pair of corners of the surface 15 which lie along the x axis. The approximate location of the corners of the surface 15 which lie along the x axis, as established from the intensity profile of FIG. 6, can now be used as the starting point to commence run length coding of the pixels along this axis. In this way, run length coding of most of the black pixels comprising the bonding material 12 of FIG. 1 is avoided, thus improving efficiency. Similarly, the intensity profile (not shown) for the pixel intensities along the y axis can be used to approximate the location of the corners of the surface 15 lying along this axis.

Once the edges of the surface 15 of the chip 10 have been located, the edges are inspected for a crack 18 during step 44 of FIG. 2. Detection of the edge crack 18 can be easily accomplished by determining whether the actual pixel intensity transition locations, as established by run length coding the pixels during step 40, substantially coincide with the expected location of the edge, as provided by equation (1). At the location along the edge of the surface 15 where the crack 18 is present, the pixels within the image of the chip will be dark (i.e., black) because of the low-intensity gradient at this location. Thus, during run length coding of the pixels in the image of FIG. 5, the transition in pixel intensity will occur at a point inside of where the edge of the surface 15 should be. At the point where the edge of the surface 15 is cracked, the location of the edge established by run length coding of the pixels will not substantially correspond to the chip edge, as defined by equation (1). Thus, by determining, at each sampling interval, whether the expected edge location corresponds to the actual edge location, a crack 18 can be detected.

Once the edges of the surface 15 have been located during step 44, the location of the surface within the captured image can be determined by the vision processor 32. After the surface 15 has been located, it is then possible to match the features 16 on the surface to those in a pattern representative of a prefectly formed chip 10. The matching can be done by the vision processor 32 feature for feature or can be done statistically, such as by comparing the area of the feature 16 on the surface 15 to those in the pattern of the perfectly formed chip 10.

The foregoing describes a technique for differentiating between a textured planar surface 15 and a surrounding background region 12 by using differences in the depth of focus so that the image of the textured surface is sharp, and thus has larger intensity gradients, which can be used to isolate it from the image of the background region. Once the image of the textured surface 15 has been isolated, the edges of the surface can be found by linear regression from the coordinates of the first location, along each of a pair of coordinate axes, at selected sampling intervals, of a sharp transition in the pixel intensity. After the edges of the surface 15 have been located, each edge can then be inspected for cracks. Further, by locating the edges of the surface 15, the orientation of the surface within the image can be found for registration purposes. Additionally, once the edges of the surface 15 have been found, it is then possible to compare the features 16 on the surface to a pattern of stored features (not shown) to determine if a match exists therebetween.

It is to be understood that the above-described embodiments are merely illustrative of the principles of the invention. Various modifications and changes may be made thereto by those skilled in the art which will embody the spirit and scope thereof.

I claim:

1. A method for differentiating between a textured, planar surface and a background region surrounding the surface comprising the steps of:

illuminating both the textured, planar surface and the surrounding background region by directing light thereat so the light strikes the surface substantially normal to the plane thereof;

capturing the image of the textured planar surface and the surrounding background region with an image-acquisition device which is positioned to sense the light reflected from the background region and the surface substantially normal to the plane of the surface thereof such that only the textured planar surface appears in focus within the captured image;

determining the intensity of each of a plurality of small areas (pixels) within the captured image;

determining the intensity gradient for each pixel;

creating a gradient image by assigning to each pixel within the captured image an intensity value according to its intensity gradient; and binarizing the gradient image by causing each pixel therein to appear bright or dark, depending on whether the intensity gradient established for each pixel is above or below a predetermined threshold, respectively, thereby eliminating the background region from the captured image.

2. The method according to claim 1 further including the step of locating at least one of the edges of the pattern of interest in the binarized image.

3. The method according to claim 2 further including the step of inspecting the located edge for any cracks.

4. The method according to claim 2 wherein each edge of the pattern is located by determining, at preselected sampling intervals along one of a pair of coordinate axes, the first location where a large difference exists between the intensity of a pair of neighboring pixels within the binarized image and then mathematically defining the edge from the locations of the pixel intensity differences.

5. The method according to claim 4 wherein the edge is inspected for cracks by comparing, at each sampling interval, the location of the edge, as established by the location of the pixel intensity difference, to the location of the edge given by the mathematical definition thereof.

6. In combination with a process of manufacturing an electronic component by bonding a semiconductor chip within a recess in a chip carrier so that a major surface of the chip remains exposed, a method for inspecting the edges of the exposed surface of the chip to detect cracks, if any, comprising the steps of:

illuminating both the exposed surface of the chip and the surrounding bonding material by directing light thereat so the light strikes the exposed surface of the chip and the surrounding bonding material substantially normal to the plane of the exposed chip surface;

capturing the image of the exposed chip surface and the surrounding background bonding material with an image-acquisition device which is positioned to sense the light reflected normally from the background region and the exposed chip surface such that only the exposed chip surface appears in focus within the captured image;

determining the intensity of each of a plurality of small areas (pixels) within the captured image;

determining the intensity gradient for each pixel;

creating a gradient image by assigning each pixel within the captured image an intensity value according to its gradient intensity;

binarizing the gradient image by causing each pixel to appear bright or dark, depending on whether the intensity gradient established for each pixel is above or below, respectively, a predetermined threshold, thereby effectively isolating the chip within the captured image;

establishing the expected location of each of the edges of the chip within the captured image; and inspecting each of the edges by detecting, at preselected intervals along each of a pair of coordinate axes, the coordinate location of where the edge of the chip is found within the image thereof and then determining whether the actual location of the edge of the chip substantially coincides with the expected location of the edge.

7. The method according to claim 6 wherein the actual location of the edges of the chip is determined from the locations, at preselected intervals along each of a pair of coordinate axes, of the first location where there is a significant difference in the intensity between a neighboring pair of pixels.

8. The method according to claim 6 wherein the expected location of the edges of the chip is established by first determining, at selected intervals along each of a pair of coordinate axes within the captured image, the locations of the first significant transitions in the pixel intensity, and then performing a linear regression analysis on the locations of the first pixel intensity transitions to establish a mathematical definition for each edge which predicts the location thereof within the image.

9. Apparatus for differentiating between a textured planar surface on an article and a background region surrounding the pattern, comprising:

means for illuminating both the textured planar surface and the surrounding background region by directing light thereat so the light strikes the surface and the surrounding background region substantially normal to the plane of each;

image-acquisition means for capturing the image of the surface and the surrounding background region, the image-acquisition means positioned such that its optical axis is substantially normal to the surface and the surface appears in focus whereas the background region appears out of focus within the captured image;

means for determining the intensity of each of a plurality of small areas (pixels) within the captured image;

means for determining the intensity gradient for each pixel;

means for establishing a gradient image of the surface and the surrounding background region; and means for binarizing the gradient image by causing each pixel to appear bright or dark, depending on whether the gradient established for each pixel is above or below a predetermined threshold, respectively, thereby eliminating the background region from the captured image.

10. The apparatus according to claim 9 further including means for detecting the edges of the pattern of interest and thereby locate the chip.

11. The apparatus according to claim 10 further including means for inspecting the edges of the chip to detect edge cracks, if any.

12. The apparatus according to claim 10 further including means for matching the textured planar surface to that of a predetermined pattern.

13. The apparatus according to claim 9 wherein the means for determining the intensity of the pixels in the captured image, the means for establishing the intensity gradient, means for establishing the gradient image, and the means for binarizing the captured image to isolate the image of the textured surface comprise a machine vision processor.

* * * * *